(12) United States Patent
Lai et al.

(10) Patent No.: US 11,617,255 B2
(45) Date of Patent: Mar. 28, 2023

(54) DROPLET GENERATOR AND METHOD OF SERVICING EXTREME ULTRAVIOLET IMAGING TOOL

(71) Applicant: TAIWAN SEMICONDUCTOR MANUFACTURING CO., LTD., Hsinchu (TW)

(72) Inventors: Wei-Chih Lai, Changhua County (TW); Han-Lung Chang, Kaohsiung (TW); Bo-Tsun Liu, Taipei (TW); Li-Jui Chen, Hsinchu (TW); Po-Chung Cheng, Chiayi County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 49 days.

(21) Appl. No.: 16/178,157

(22) Filed: Nov. 1, 2018

(65) Prior Publication Data

US 2019/0150266 A1    May 16, 2019

Related U.S. Application Data

(60) Provisional application No. 62/586,679, filed on Nov. 15, 2017.

(51) Int. Cl.
*H05G 2/00* (2006.01)
*G03F 7/20* (2006.01)

(52) U.S. Cl.
CPC ......... *H05G 2/008* (2013.01); *G03F 7/70033* (2013.01); *H05G 2/006* (2013.01)

(58) Field of Classification Search
None
See application file for complete search history.

(56) References Cited

U.S. PATENT DOCUMENTS

| | | | |
|---|---|---|---|
| 6,215,202 B1 * | 4/2001 | Luongo | H02J 15/00 307/23 |
| 8,796,666 B1 | 8/2014 | Huang et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,869,928 B2 | 1/2018 | Huang et al. | |
| 9,869,934 B2 | 1/2018 | Huang et al. | |
| 9,869,939 B2 | 1/2018 | Yu et al. | |
| 2005/0271957 A1 * | 12/2005 | Miyachi | G03F 7/70316 430/30 |
| 2014/0008552 A1 * | 1/2014 | Umeda | G03F 7/70033 250/504 R |
| 2014/0261761 A1 * | 9/2014 | Vaschenko | H05G 2/006 137/334 |

(Continued)

*Primary Examiner* — Michael J Logie
(74) *Attorney, Agent, or Firm* — McDermott Will & Emery LLP (57) ABSTRACT

A droplet generator for an extreme ultraviolet imaging tool includes a reservoir for a molten metal, and a nozzle having a first end connected to the reservoir and a second opposing end where molten metal droplets emerge from the nozzle. A gas inlet is connected to the nozzle, and an isolation valve is at the second end of the nozzle configured to seal the nozzle droplet generator from the ambient.

21 Claims, 7 Drawing Sheets

(56) References Cited

U.S. PATENT DOCUMENTS

| | | | |
|---|---|---|---|
| 2015/0029478 A1* | 1/2015 | Schimmel | G03F 7/70033 355/67 |
| 2017/0280543 A1* | 9/2017 | Hori | H05G 2/005 |
| 2018/0160519 A1* | 6/2018 | Iwamoto | H05G 2/008 |

* cited by examiner

DROPLET GENERATOR AND METHOD OF SERVICING EXTREME ULTRAVIOLET IMAGING TOOL

CROSS-REFERENCE TO RELATED APPLICATIONS

This application claims priority to U.S. Provisional Patent Application 62/586,679 filed Nov. 15, 2017, the entire disclosure of which is incorporated herein by reference.

TECHNICAL FIELD

The disclosure relates to a droplet generator for an extreme ultraviolet imaging tool and a method of servicing the extreme ultraviolet imaging tool.

BACKGROUND

As consumer devices have gotten smaller and smaller in response to consumer demand, the individual components of these devices have necessarily decreased in size as well. Semiconductor devices, which make up a major component of devices such as mobile phones, computer tablets, and the like, have been pressured to become smaller and smaller, with a corresponding pressure on the individual devices (e.g., transistors, resistors, capacitors, etc.) within the semiconductor devices to also be reduced in size. The decrease in size of devices has been met with advancements in semiconductor manufacturing techniques such as lithography.

For example, the wavelength of radiation used for lithography has decreased from ultraviolet to deep ultraviolet (DUV) and, more recently to extreme ultraviolet (EUV). Further decreases in component size require further improvements in resolution of lithography which are achievable using extreme ultraviolet lithography (EUVL). EUVL employs radiation having a wavelength of about 1-100 nm.

As the semiconductor industry has progressed into nanometer technology process nodes in pursuit of higher device density, higher performance, and lower costs, there have been challenges in reducing semiconductor feature size.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The present disclosure is generally related to extreme ultraviolet (EUV) lithography systems and methods. More particularly, it is related to extreme ultraviolet lithography (EUVL) tools and methods of servicing the tools. In an EUVL tool, a laser-produced plasma (LPP) generates extreme ultraviolet radiation which is used to image a photoresist coated substrate. In an EUV tool, an excitation laser heats metal (e.g., tin, lithium, etc.) target droplets in the LPP chamber to ionize the droplets to plasma which emits the EUV radiation. For reproducible generation of EUV radiation, the target droplets arriving at the focal point (also referred to herein as the "zone of excitation") have to be substantially the same size and arrive at the zone of excitation at the same time as an excitation pulse from the excitation laser arrives. Thus, stable generation of target droplets that travel from the target droplet generator to the zone of excitation at a uniform (or predictable) speed contributes to efficiency and stability of the LPP EUV radiation source. In embodiments of the present disclosure target droplets are reproducibly generated and the target droplets travel at a uniform speed and without a change in their size or shape.

Figure 1:
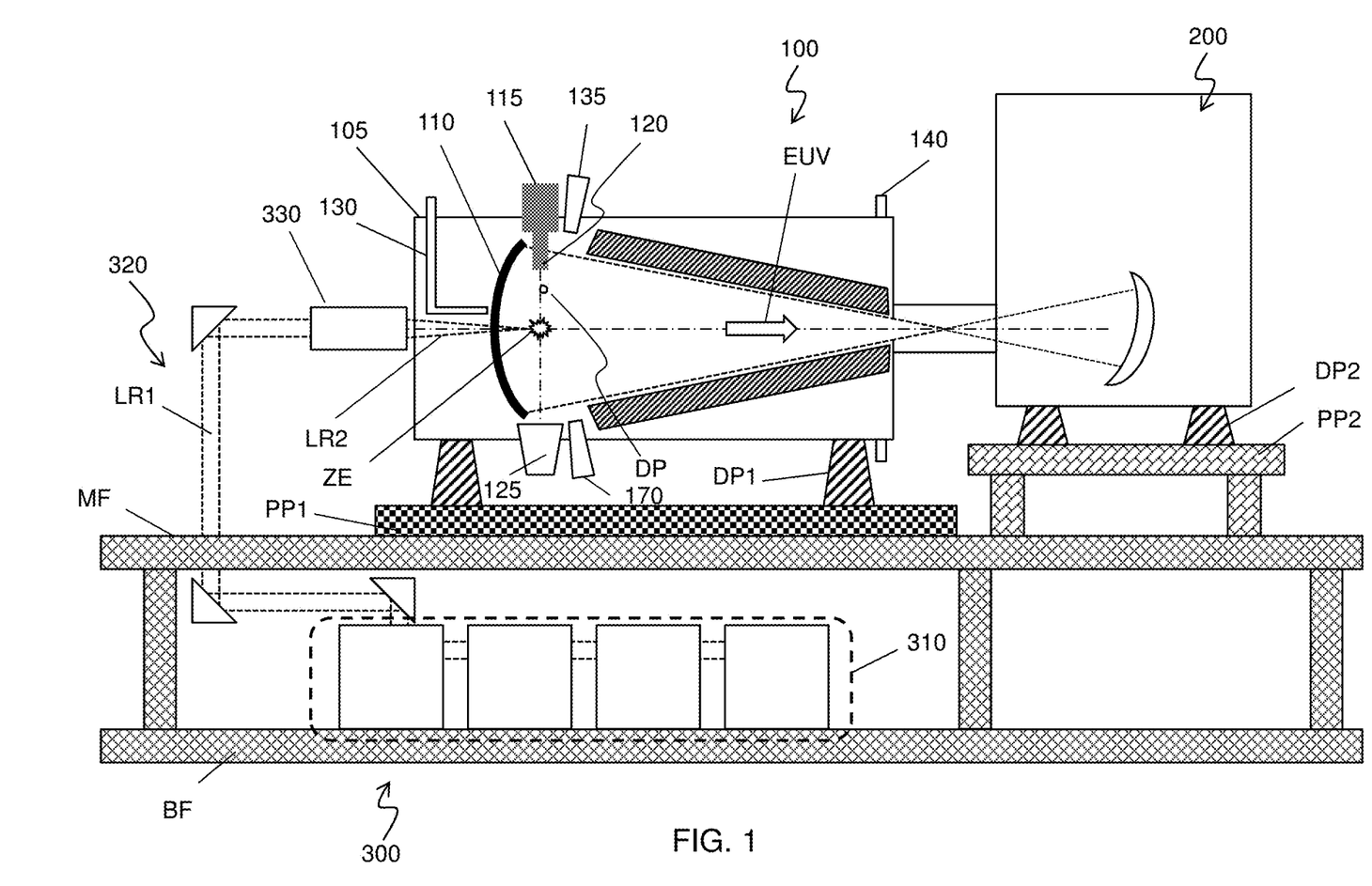
FIG. 1 shows an extreme ultraviolet lithography tool according to an embodiment of the disclosure.

FIG. 1 is a schematic view of an EUV lithography tool with a laser production plasma (LPP) based EUV radiation source, constructed in accordance with some embodiments of the present disclosure. The EUV lithography system includes an EUV radiation source 100 to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DP1 and DP2, respectively. The EUV radiation source 100 and the exposure device 200 are coupled to each other by a coupling mechanism, which may include a focusing unit.

The EUV lithography tool is designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure device 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask.

Figure 2:
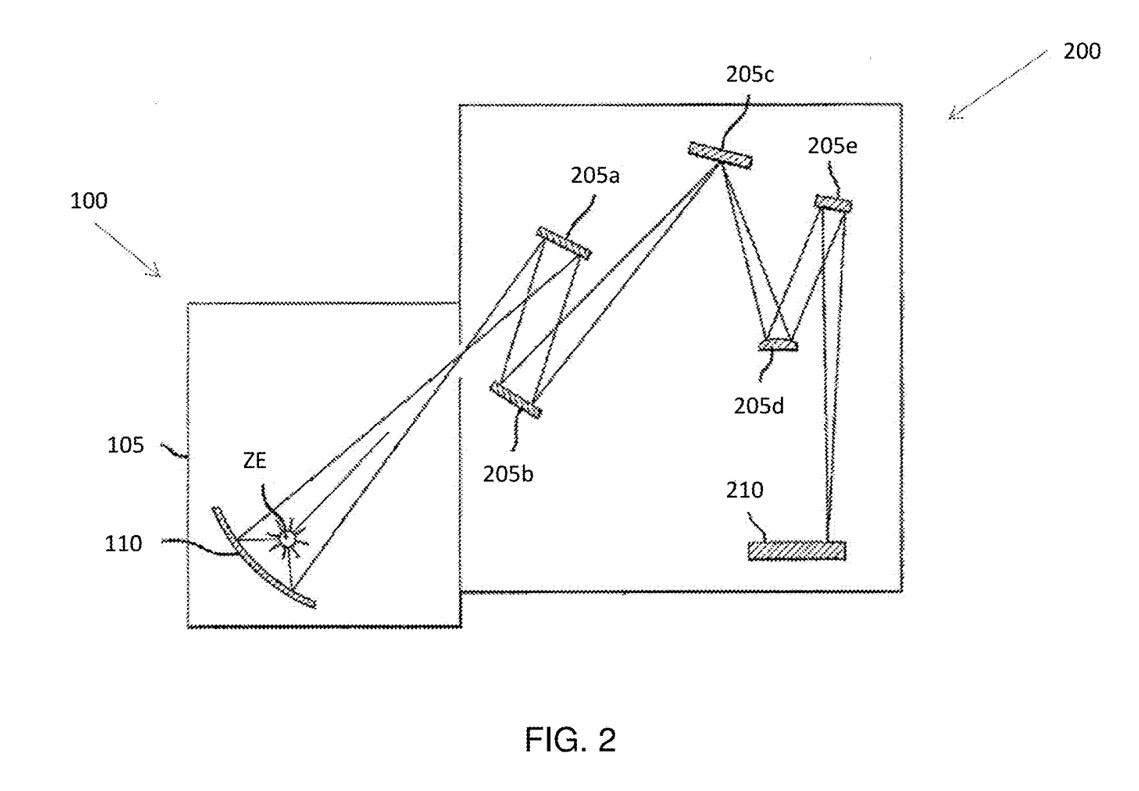
FIG. 2 shows a schematic diagram of a detail of an extreme ultraviolet lithography tool according to an embodiment of the disclosure.

FIG. 2 is a simplified schematic diagram of a detail of an extreme ultraviolet lithography tool according to an embodiment of the disclosure showing the exposure of photoresist coated substrate 210 with a patterned beam of EUV light. The exposure device 200 is an integrated circuit lithography tool such as a stepper, scanner, step and scan system, direct write system, device using a contact and/or proximity mask, etc., provided with one or more optics 205a, 205b, for example, to illuminate a patterning optic 205c, such as a reticle, with a beam of EUV light, to produce a patterned beam, and one or more reduction projection optics 205d, 205e, for projecting the patterned beam onto the substrate 210. A mechanical assembly (not shown) may be provided for generating a controlled relative movement between the substrate 210 and patterning optic 205c. As further shown in FIG. 2, the EUVL tool includes an EUV light source 100 including an EUV light radiator ZE emitting EUV light in a chamber 105 that is reflected by a collector 110 along a path into the exposure device 200 to irradiate the substrate 210.

As used herein, the term "optic" is meant to be broadly construed to include, and not necessarily be limited to, one or more components which reflect and/or transmit and/or operate on incident light, and includes, but is not limited to, one or more lenses, windows, filters, wedges, prisms, grisms, gratings, transmission fibers, etalons, diffusers, homogenizers, detectors and other instrument components, apertures, axicons and mirrors including multi-layer mirrors, near-normal incidence mirrors, grazing incidence mirrors, specular reflectors, diffuse reflectors and combinations thereof. Moreover, unless otherwise specified, neither the term "optic", as used herein, are meant to be limited to components which operate solely or to advantage within one or more specific wavelength range(s) such as at the EUV output light wavelength, the irradiation laser wavelength, a wavelength suitable for metrology or any other specific wavelength.

Because gas molecules absorb EUV light, the lithography system for the EUV lithography patterning is maintained in a vacuum or a low pressure environment to avoid EUV intensity loss.

In the present disclosure, the terms mask, photomask, and reticle are used interchangeably. In the present embodiment, the patterning optic 205c is a reflective mask. In an embodiment, the reflective mask 205c includes a substrate with a suitable material, such as a low thermal expansion material or fused quartz. In various examples, the material includes $TiO_2$ doped $SiO_2$, or other suitable materials with low thermal expansion. The reflective mask 205c includes multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configured to highly reflect the EUV light. The mask 205c may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

In various embodiments of the present disclosure, the photoresist coated substrate 210 is a semiconductor wafer, such as a silicon wafer or other type of wafer to be patterned.

The EUVL tool further include other modules or is integrated with (or coupled with) other modules in some embodiments.

As shown in FIG. 1, the EUV radiation source 100 includes a target droplet generator 115 and a LPP collector 110, enclosed by a chamber 105. In various embodiments, the target droplet generator 115 includes a reservoir (see FIG. 3) to hold a source material and a nozzle 120 through which target droplets DP of the source material are supplied into the chamber 105.

In some embodiments, the target droplets DP are droplets of tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, having a diameter of about 10 μm to about 100 μm. In other embodiments, the target droplets DP are tin droplets having a diameter of about 25 μm to about 50 μm. In some embodiments, the target droplets DP are supplied through the nozzle 120 at a rate in a range from about 50 droplets per second (i.e., an ejection-frequency of about 50 Hz) to about 50,000 droplets per second (i.e., an ejection-frequency of about 50 kHz). In some embodiments, the target droplets DP are supplied at an ejection-frequency of about 100 Hz to a about 25 kHz. In other embodiments, the target droplets DP are supplied at an ejection frequency of about 500 Hz to about 10 kHz. The target droplets DP are ejected through the nozzle 127 and into a zone of excitation ZE at a speed in a range of about 10 meters per second (m/s) to about 100 m/s in some embodiments. In some embodiments, the target droplets DP have a speed of about 10 m/s to about 75 m/s. In other embodiments, the target droplets have a speed of about 25 m/s to about 50 m/s.

Referring back to FIG. 1, an excitation laser LR2 generated by the excitation laser source 300 is a pulse laser. The laser pulses LR2 are generated by the excitation laser source 300. The excitation laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd:YAG) laser source with a wavelength in the infrared region of the electromagnetic spectrum. For example, the laser source 310 has a wavelength of 9.4 μm or 10.6 μm, in an embodiment. The laser light LR1 generated by the laser generator 300 is guided by the laser guide optics 320 and focused into the excitation laser LR2 by the focusing apparatus 330, and then introduced into the EUV radiation source 100.

In some embodiments, the excitation laser LR2 includes a pre-heat laser and a main laser. In such embodiments, the pre-heat laser pulse (interchangeably referred to herein as the "pre-pulse) is used to heat (or pre-heat) a given target droplet to create a low-density target plume with multiple smaller droplets, which is subsequently heated (or reheated) by a pulse from the main laser, generating increased emission of EUV light.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser LR2 is matched with the ejection-frequency of the target droplets DP in an embodiment.

The laser light LR2 is directed through windows (or lenses) into the zone of excitation ZE. The windows adopt a suitable material substantially transparent to the laser beams. The generation of the pulse lasers is synchronized with the ejection of the target droplets DP through the nozzle 120. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma is generated. The plasma emits EUV radiation EUV, which is collected by the collector mirror 110. The collector 110 further reflects and focuses the EUV radiation for the lithography exposing processes performed through the exposure device 200. The droplet catcher 125 is used for catching excessive target droplets. For example, some target droplets may be purposely missed by the laser pulses.

Referring back to FIG. 1, the collector 110 is designed with a proper coating material and shape to function as a mirror for EUV collection, reflection, and focusing. In some embodiments, the collector 110 is designed to have an ellipsoidal geometry. In some embodiments, the coating material of the collector 100 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In such an EUV radiation source, the plasma caused by the laser application creates physical debris, such as ions, gases and atoms of the droplet, as well as the desired EUV radiation. It is necessary to prevent the accumulation of material on the collector 110 and also to prevent physical debris exiting the chamber 105 and entering the exposure device 200.

As shown in FIG. 1, in the present embodiment, a buffer gas is supplied from a first buffer gas supply 130 through the aperture in collector 110 by which the pulse laser is delivered to the tin droplets. In some embodiments, the buffer gas is $H_2$, He, Ar, $N_2$ or another inert gas. In certain embodiments, $H_2$ used as H radicals generated by ionization of the buffer gas can be used for cleaning purposes. The buffer gas can also be provided through one or more second buffer gas supplies 135 toward the collector 110 and/or around the edges of the collector 110. Further, the chamber 105 includes one or more gas outlets 140 so that the buffer gas is exhausted outside the chamber 105.

Hydrogen gas has low absorption to the EUV radiation. Hydrogen gas reaching the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140.

Figure 3:
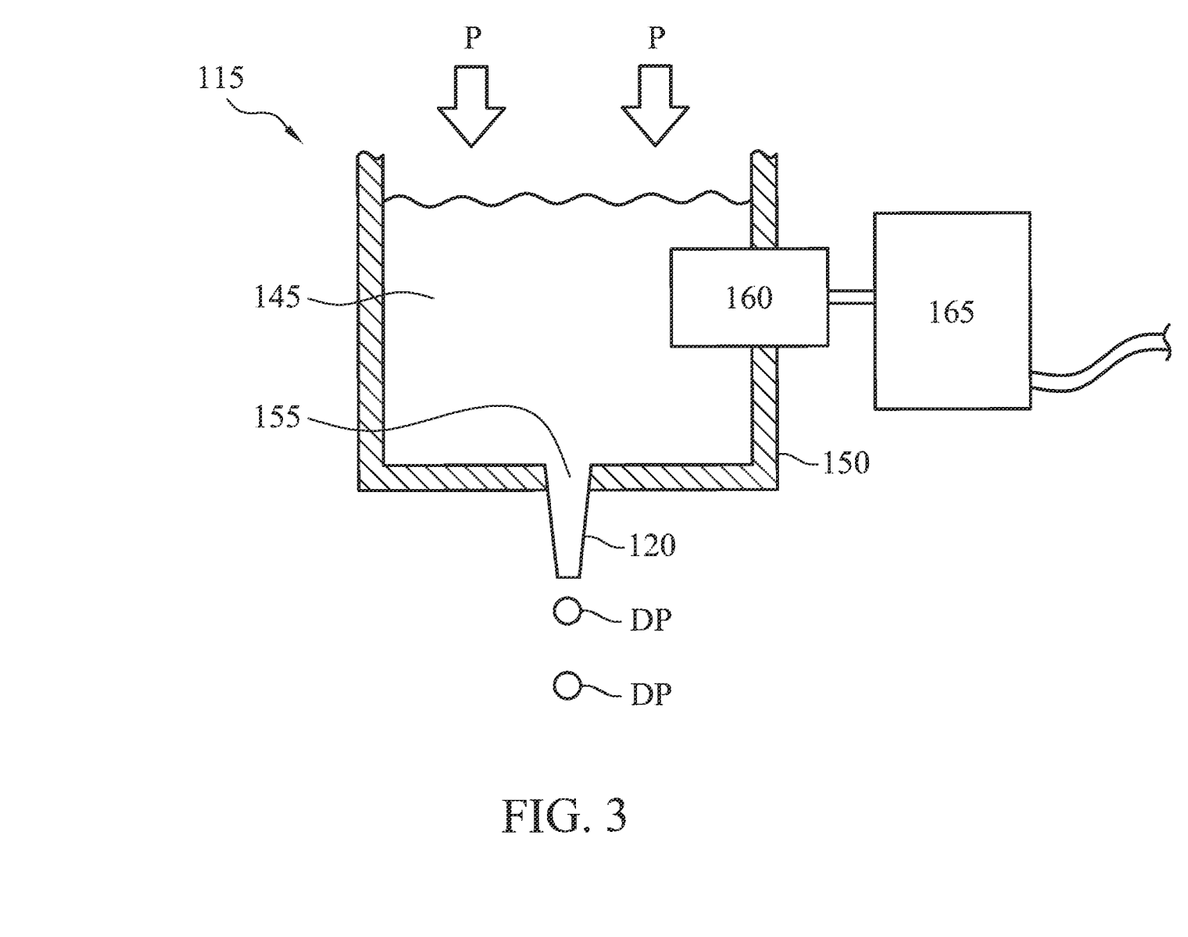
FIG. 3 shows a schematic diagram of a droplet generator according to an embodiment of the disclosure.

FIG. 3 illustrates the components of the droplet generator 115 in schematic format. As shown there, the droplet generator 115 includes a reservoir 150 holding a fluid 145, e.g. molten tin, under pressure P. The reservoir 150 is formed with an orifice 155 allowing the pressurized fluid 145 to flow through the orifice 155 establishing a continuous stream which subsequently breaks into a plurality of droplets DP exiting the nozzle 120.

The target droplet generator 115 shown further includes a sub-system producing a disturbance in the fluid 145 having an electro-actuatable element 160 that is operably coupled with the fluid 145 and a signal generator 165 driving the electro-actuatable element 160 in some embodiments. In some embodiments, the electro-actuatable element 160 is a piezoelectric actuator that applies vibration to the fluid 145. In some embodiments, the electro-actuatable element 160 is an ultrasonic transducer or a megasonic transducer.

Figure 4:
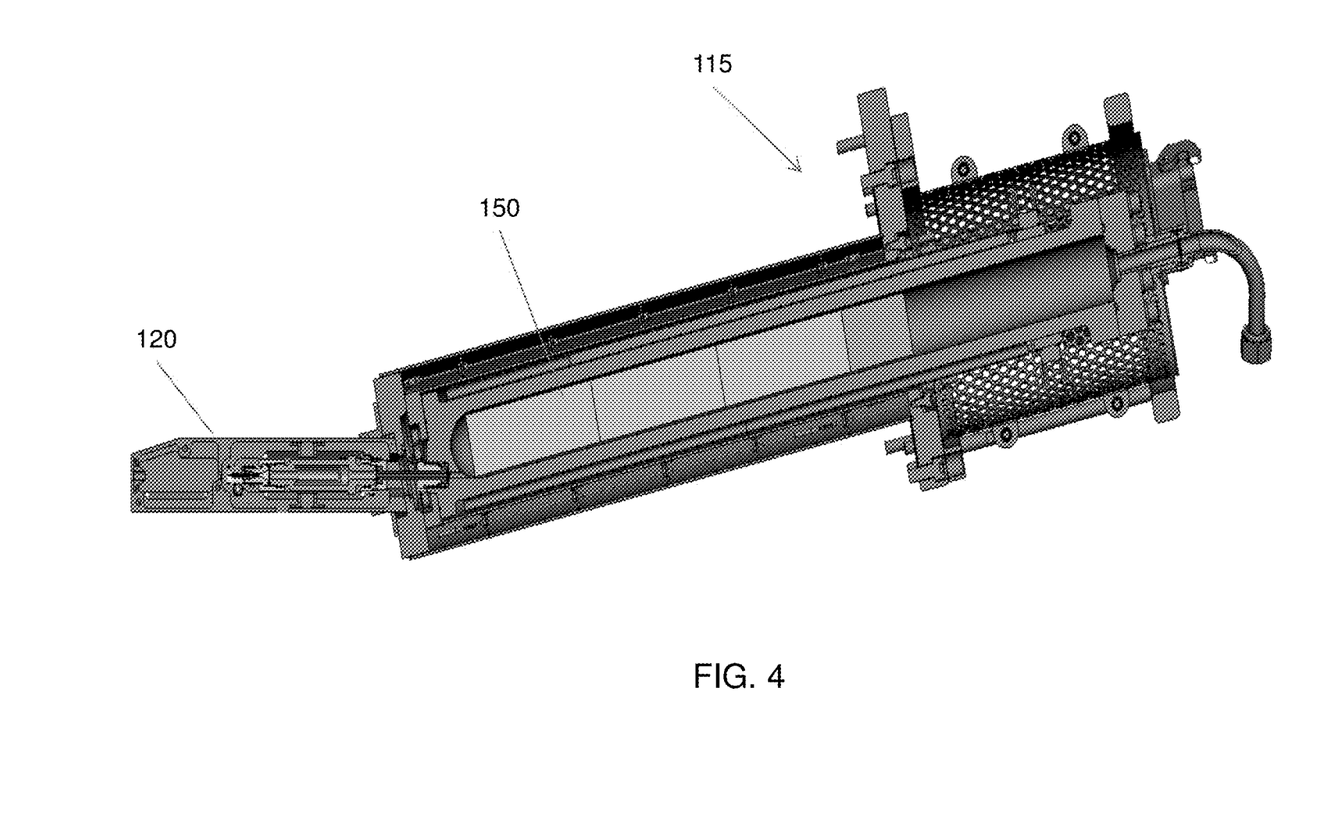
FIG. 4 shows a detailed view of a droplet generator according to an embodiment of the disclosure.

A detailed cross section view of the droplet generator 115 according to an embodiment is shown in FIG. 4. The droplet generator 115 includes a reservoir 150 containing the molten metal 145 and nozzle 120 at the end of the reservoir 150.

In some embodiments, the nozzle 120 is maintained at a certain temperature that is higher than the melting point of the source material. However, under certain conditions such as, for example, if the chamber 105 is vented for a service or if there is an unscheduled change in temperature of the chamber 105, temperature of the nozzle 120 may be reduced to below the melting point of the source material, e.g., tin. When the nozzle 120 cools down, liquid source material may leak through the nozzle because of particulate formation at the nozzle 120. The leaked source material may get deposited on the collector 110 resulting in a reduction in the reflectivity of the collector 110. This in turn results in the loss of stability and efficiency of the EUV radiation source 100. In some cases, replacement of the collector 110 may be required, leading to unnecessary and avoidable expense as well as down-time for the entire lithography system.

In addition, if the chamber 105 is vented the molten source material may react with oxygen in the ambient resulting in the formation of metal oxide particulate contamination. For example, molten tin may react with oxygen forming tin oxide solid particles. The tin oxide particles can coat optical surfaces in the EUVL tool. The metal oxide particles may also clog the nozzle 120 interfering with subsequent droplet flow when the EUVL tool is restarted.

Figure 5:
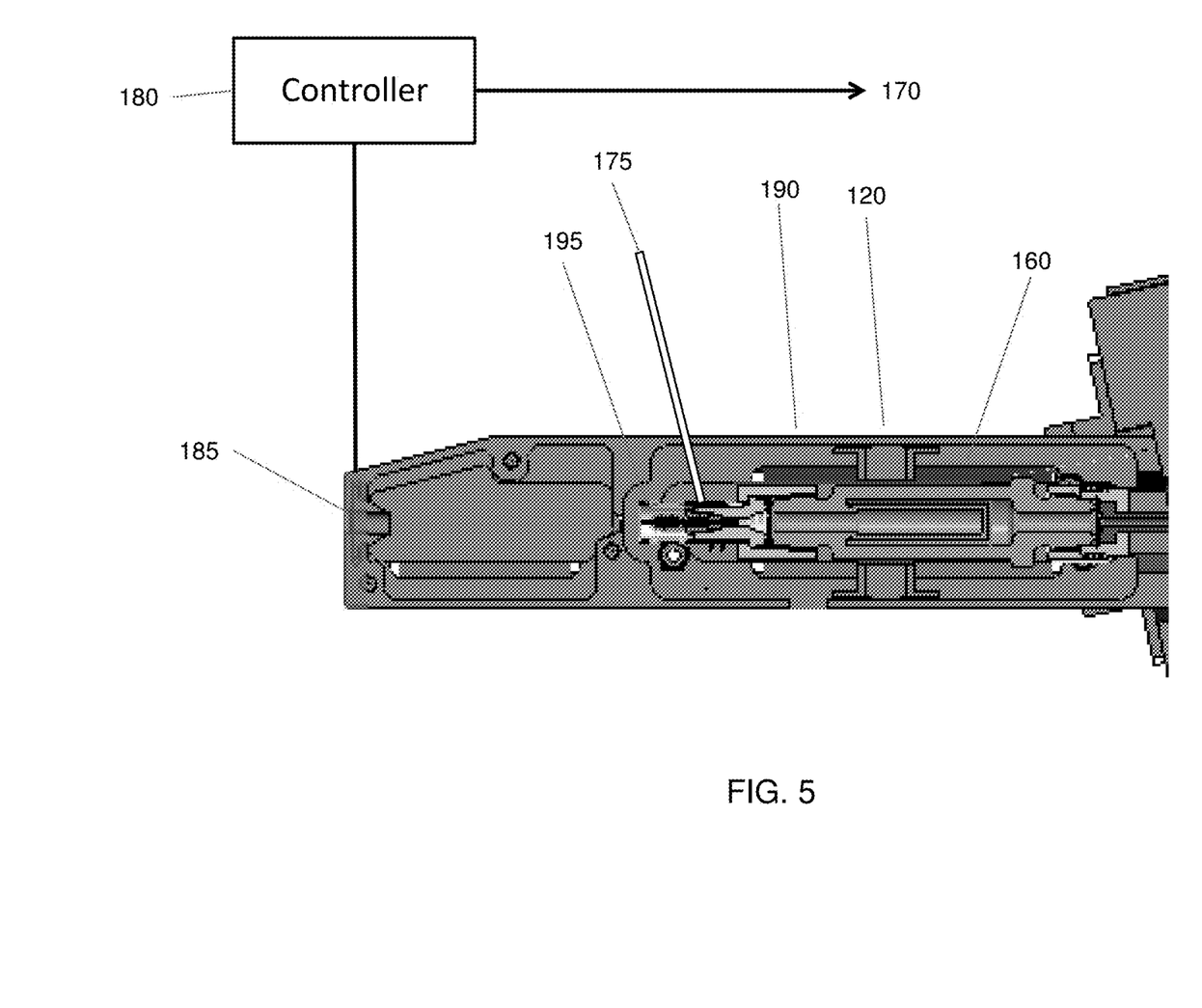
FIG. 5 shows a detailed view of a droplet generator nozzle according to an embodiment of the disclosure.

FIG. 5 shows a detailed view of a droplet generator nozzle 120 according to an embodiment of the disclosure. The outer body 190 of the nozzle 120 is made of a metal, such as titanium or stainless steel in some embodiments. The tip of the nozzle 195, where the droplets DP are generated, is comprised of a strong, non-fragile material in some embodiments, for example a metal (e.g., titanium), a ceramic, silicon or a silicon based compound, such as silicon nitride. The nozzle tip 195 should be made of a material that can withstand the temperatures required to maintain the target metal in the molten state and not react with molten target metal. In some embodiments, the nozzle tip 195 is made of silicon coated with silicon nitride. Such a nozzle tip 195 will be able to withstand high pressures within the nozzle, and therefore, high gas pressures can be used to force the molten metal through the nozzle 120.

An isolation valve 185 is located at the end of the nozzle 120. The isolation valve 185 is open during operation of the, droplet generator 115. When maintenance or servicing of the radiation source 100 is required, the isolation valve 185 closes to seal the nozzle 120. The chamber 105 of the EUV radiation source 100 is maintained under vacuum or low pressure during operation of the EUVL tool. Because EUV light is absorbed by most materials, including gases, it is necessary to operate the EUV tool under low pressure or vacuum to prevent loss of exposure light energy during imaging operations.

The vacuum chamber 105 may be opened when it is necessary to perform maintenance or service the EUVL tool. Exposing the vacuum chamber to the ambient atmosphere introduces oxygen, which readily reacts with heated metals to form metal oxides. For example, the oxygen may react with molten tin in the nozzle 115 to form tin oxides, such as stannous oxide (SnO) and stannic oxide ($SnO_2$). In some embodiments, the molten tin is maintained at a temperature of about 250° C. At this temperature tin oxides are solid. Thus, any tin oxides that would form would precipitate out of the molten tin. The tin oxides would form solid particles that could clog the nozzle tip 195, or coat the collector mirror 110 reducing mirror reflectivity. The tin oxide particles could also deposit on optics in the exposure device 200 and interfere with the pattern imaging.

To prevent the formation of tin oxide particulate contamination, the isolation valve 185 closes to seal the nozzle 120 and prevent oxygen from entering the nozzle 120 and reacting with molten tin 145 in some embodiments.

An inert gas inlet 175 is connected to the nozzle 120 to provide an inert gas to the nozzle 120 to further prevent oxygen or other reactive gases from reacting with the molten target material 145. When the EUV tool is shut down for servicing or maintenance, inert gas is introduced to nozzle 120 through the inert gas line 175 in some embodiments. The inert gas line is connected to a source of the inert gas. In some embodiments, the inert gas is helium, neon, argon, xenon, or nitrogen.

In some embodiments, an electro-actuatable element 160, such as a piezoelectric element, is located in the nozzle 120 to vibrate the nozzle 120 and form droplets DP.

In some embodiments, the isolation valve 185 is controlled by a controller 180. The controller is connected to a pressure sensor 170 in the vacuum chamber 105. For example, when the pressure sensor 170 senses an increase in pressure above a threshold pressure (i.e.—loss of vacuum) in the vacuum chamber 105, the controller 180 closes the isolation valve 185 to prevent oxygen from entering the nozzle 120. In some embodiments, when the pressure in the vacuum chamber 105 is reduced below a threshold pressure, the controller 180 opens the isolation valve 185. Therefore, in some embodiments, when the chamber is opened for maintenance or servicing, the pressure sensor 170 detects the increase in pressure and the controller 180 closes the isolation valve 185. After servicing the tool, a vacuum is drawn in the chamber 105 so that EUV production can continue. When the vacuum reaches a threshold pressure the controller 180 opens isolation valve 185 and droplet generation can begin.

During maintenance or servicing, the nozzle 120 can cool down. If the nozzle cools down, it will have to be brought back up to operating temperature prior to restarting the droplet generator 115. This can increase downtime during maintenance or servicing. Further, a change in temperature of the nozzle 120 changes the droplet quality. The droplet generator may need to be recalibrated after it cools down, which further increase tool downtime during maintenance and servicing. Therefore, it is desirable to keep the nozzle 120 heated during maintenance or servicing.

Figure 6:
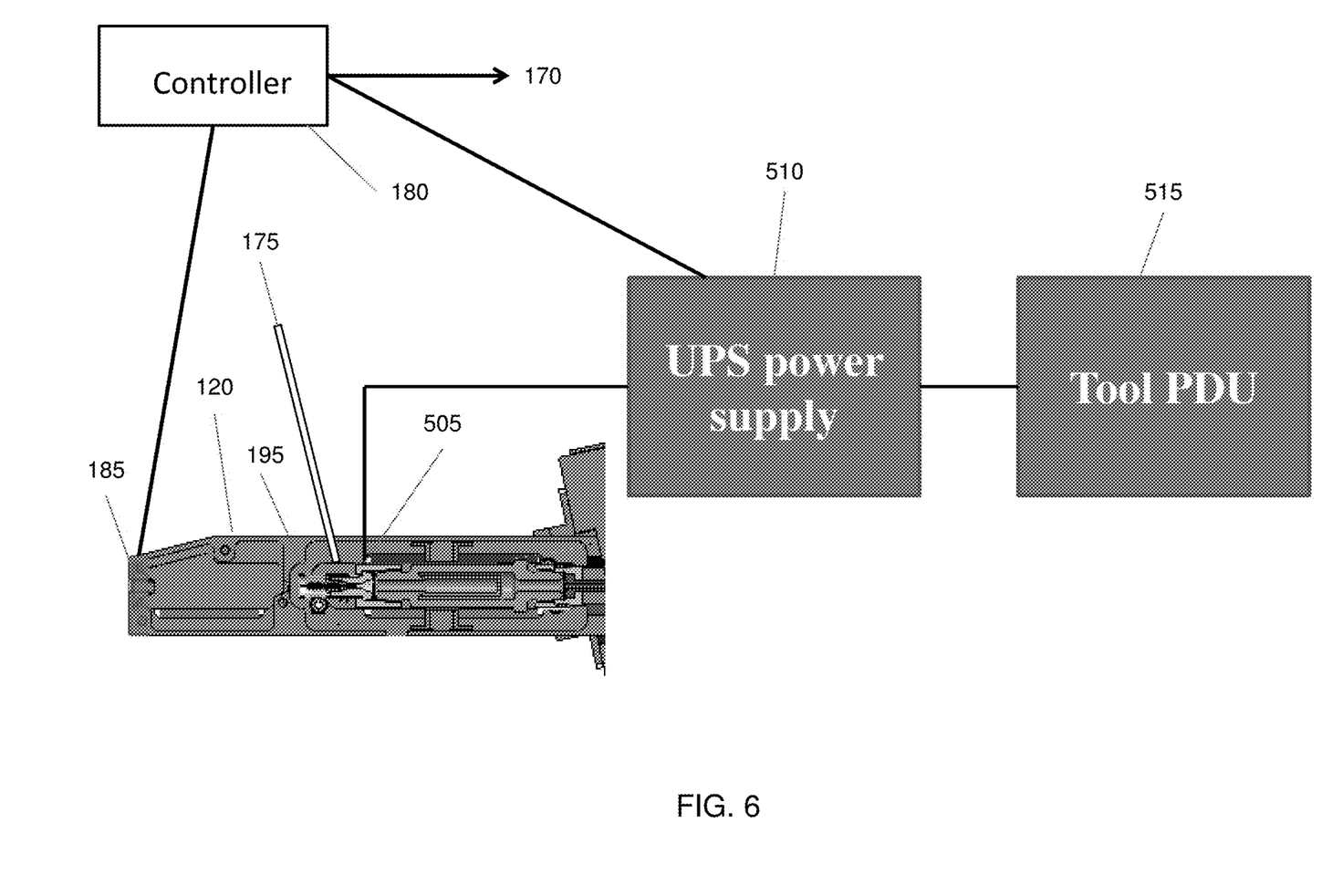
FIG. 6 shows a view of droplet generator nozzle according to an embodiment of the disclosure.

In some embodiments, a heating element 505 is connected to the nozzle 120 to maintain the nozzle at the operating temperature during maintenance and servicing, as shown in FIG. 6. In some embodiments, the temperature of the nozzle is maintained at about 250° C. during maintenance and servicing. The heating element 505 is connected to an uninterruptible power supply 510 to continuously provide power to the heating element 505 during maintenance or servicing. In some embodiments, the uninterruptible power supply 510 is connected to a power distribution unit 515 of the EUVL tool. In some embodiments, the uninterruptible power supply 510 is connected to the controller 180. In some embodiments, the controller 180 closes the isolation valve 185 and activates the uninterruptible power supply 510 substantially simultaneously. In some embodiments, the controller 180 also opens a valve from the inert gas source (not shown) to cause inert gas to flow into the nozzle 120 through inlet 175. In some embodiments, the controller 180 closes the isolation valve 185, initiates inert gas flow to the nozzle 120, and activates the uninterruptible power supply 510 to power the heating element 505 substantially simultaneously.

Figure 7:
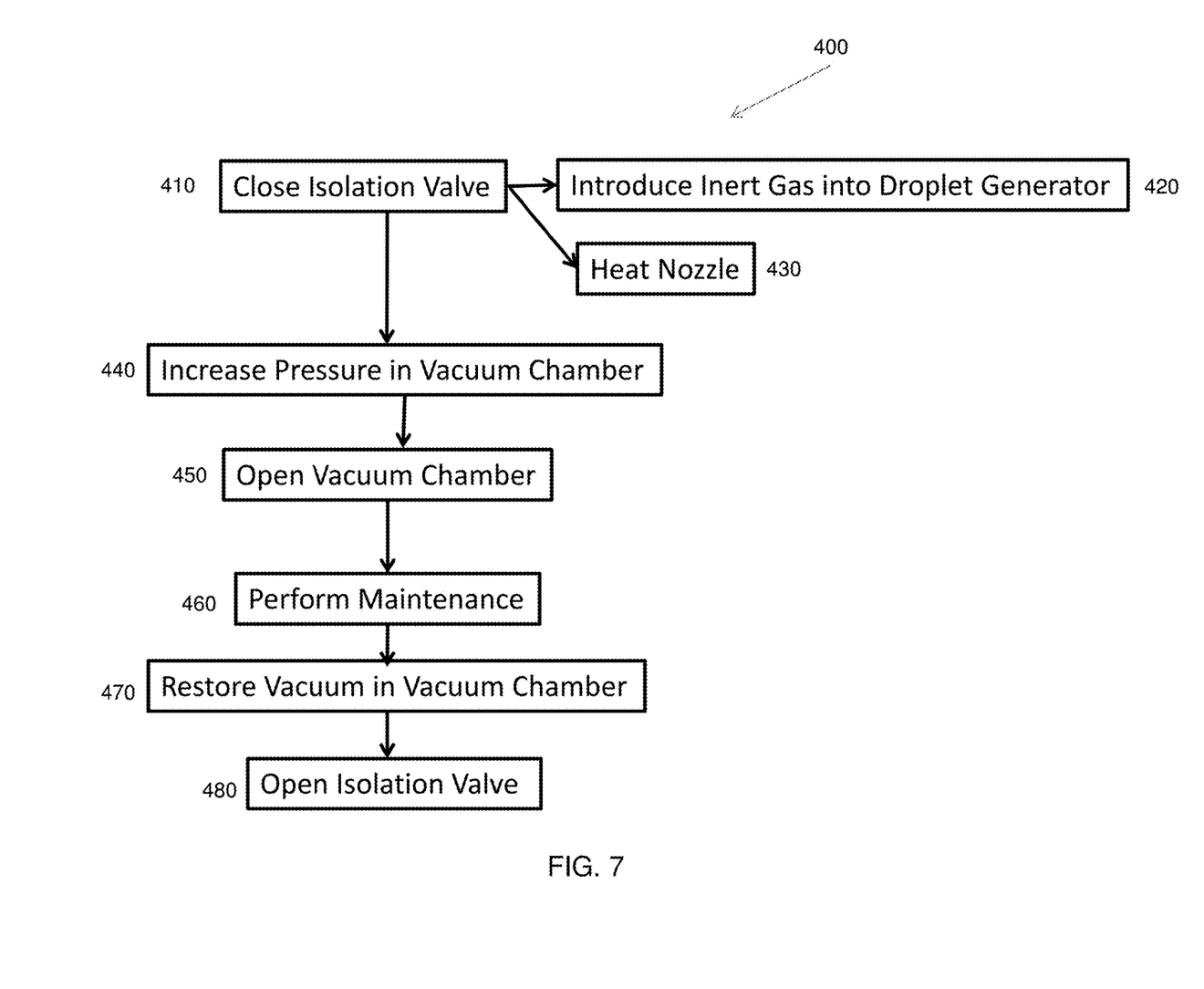
FIG. 7 is a flowchart of a method of servicing an extreme ultraviolet lithography tool according to an embodiment of the disclosure.

In some embodiments, a method 400 of servicing an extreme ultraviolet lithography tool includes closing the isolation valve 185 to isolate the nozzle 120 from an atmosphere of the vacuum chamber 105 in operation 410, as shown in the flowchart of FIG. 7. In some embodiments inert gas is introduced into the droplet generator 115 in operation 420 when the isolation valve 185 is closed. In some embodiments, the inert gas is introduced into the nozzle portion 120 of the droplet generator 115. Heat is applied to the nozzle 120 via a heating element 505 when the isolation valve 185 is closed in some embodiments in operation 430 to heat the nozzle 120 and maintain the nozzle 120 at its operating temperature. The pressure in the vacuum chamber 105 is increased so it is no longer a vacuum atmosphere in operation 440, and the vacuum chamber 105 is opened in operation 450 so that maintenance or servicing can be performed. Maintenance or servicing is performed on one or more components in the vacuum chamber 105 in operation 460. Maintenance or servicing includes replacing or repairing parts that need to be repaired or replaced, and cleaning the components in the chamber 105. For example, in some embodiments, the collector 110 may need to be cleaned or replaced because its surface is covered with tin droplets or other particulate contamination. Alternatively, sensors in the chamber may need to be cleaned, repaired, or replaced during the maintenance or servicing. After maintenance or servicing is performed, the chamber 105 is sealed and the vacuum is restored in operation 470. When the vacuum reaches a threshold pressure, the isolation valve 185 is opened in operation 480, thereby exposing the nozzle to the vacuum chamber atmosphere. Processing of photoresist coated substrates 210 subsequently continues after the isolation valve 185 is opened in some embodiments.

Embodiments of the present disclosure provide the benefit of reducing downtime during maintenance and servicing of EUVL tools. Thus, the EUVL tool is more efficiently used. Embodiments of the present disclosure also reduce particulate contamination in the EUV tool by preventing the formation of target metal oxides, such as tin oxides, during maintenance and servicing. In addition, embodiments of the present disclosure prevent clogging of the droplet generator nozzle.

An embodiment of the present disclosure is a droplet generator for an extreme ultraviolet imaging tool, including a reservoir for a molten metal, and a nozzle having a first end connected to the reservoir and a second opposing end where molten metal droplets emerge from the nozzle. A gas inlet is connected to the nozzle, and an isolation valve is at the second end of the nozzle configured to seal the nozzle of the droplet generator from the ambient. In an embodiment, the droplet generator includes an actuator to generate droplets at the second end of the nozzle. In an embodiment, the actuator is a piezoelectric actuator. In an embodiment, a heating element is connected to the nozzle. In an embodiment, the heating element is connected to an uninterruptable power supply. In an embodiment, an inert gas supply is connected to the gas inlet. In an embodiment, the nozzle has a nozzle tip made of silicon or a silicon-based compound.

Another embodiment of the present disclosure is an extreme ultraviolet lithography (EUVL) tool including an extreme ultraviolet radiation source, an exposure device, and a laser source. The extreme ultraviolet radiation source includes a vacuum chamber, a droplet generator configured to generate target droplets located on a first side of the vacuum chamber, a laser produced plasma collector located on a second side of the vacuum chamber adjacent the first side configured to collect, focus, and direct extreme ultraviolet radiation towards the exposure device, and a droplet catcher located on a third side of the vacuum chamber opposing the droplet generator. The droplet generator includes a reservoir for a molten metal, a nozzle having a first end connected to the reservoir and a second opposing end where molten metal droplets emerge from the nozzle, a gas inlet connected to the nozzle, and an isolation valve at the second end of the nozzle configured to seal the droplet generator from the vacuum chamber. In an embodiment, the extreme ultraviolet lithography tool includes a piezoelectric actuator to generate droplets at the second end of the nozzle. In an embodiment, the droplet generator includes a heating element connected to the nozzle. In an embodiment, the heating element is connected to an uninterruptable power supply. In an embodiment, the exposure device includes a scanner and a substrate stage for supporting a photoresist coated substrate to be imaged. In an embodiment, the exposure device includes a reflective mask having a pattern to be formed in the photoresist coated on the substrate. In an embodiment, a pressure sensor is in the vacuum chamber. In an embodiment, the laser source is a $CO_2$ laser.

Another embodiment of the present disclosure is a method of servicing an extreme ultraviolet lithography tool including providing an extreme ultraviolet lithography tool including an extreme ultraviolet radiation source including a vacuum chamber containing a vacuum atmosphere. A droplet generator configured to generate droplets of a molten metal is located on a first side of the vacuum chamber. The droplet generator includes a reservoir for a molten metal, and a nozzle having a first end connected to the reservoir and a second opposing end where molten metal droplets emerge from the nozzle. An isolation valve is at the second end of the nozzle configured to isolate the droplet generator from the vacuum chamber. The method includes closing the isolation valve to isolate the nozzle from an atmosphere of the vacuum chamber. The pressure in the vacuum chamber is increased so it is no longer a vacuum atmosphere, and the vacuum chamber is opened. Maintenance is performed on one or more components in the vacuum chamber. The vacuum atmosphere is restored in the vacuum chamber, and the isolation valve is opened, thereby exposing the nozzle to the vacuum chamber atmosphere. In an embodiment, an inert gas is introduced into the droplet generator after closing the isolation valve. In an embodiment, the inert gas is one or more selected from the group consisting of nitrogen, helium, neon, argon, and xenon. In an embodiment, the nozzle is heated while performing maintenance on one or more components in the vacuum chamber to maintain the molten metal in a molten state. In an embodiment, the vacuum chamber includes a pressure sensor, and when the pressure sensor senses a loss of vacuum in the vacuum chamber the isolation valve is automatically closed.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A droplet generator for an extreme ultraviolet imaging tool inside a chamber, comprising:
    a reservoir for a molten metal;
    a nozzle having a first end connected to the reservoir and a second opposing end where molten metal droplets emerge from the nozzle;
    a pressure sensor configured to measure pressure in the chamber;
    a gas inlet directly connected to the nozzle; and
    an isolation valve at the second end of the nozzle, the isolation valve configured to seal the nozzle of the droplet generator from an ambient atmosphere outside the chamber,
    wherein a controller operatively connected to the pressure sensor is configured to close the isolation valve, initiate an inert gas flow to the nozzle through the gas inlet, and activate an uninterruptable power supply substantially simultaneously based on the measured pressure by the pressure sensor.

2. The droplet generator of claim 1, further comprising an actuator to generate droplets at the second end of the nozzle.

3. The droplet generator of claim 2, wherein the actuator is a. piezoelectric actuator.

4. The droplet generator of claim 1, further comprising a heating element connected to the nozzle.

5. The droplet generator of claim 4, wherein the heating element is connected to the uninterruptable power supply.

6. The droplet generator of claim 1, wherein an inert gas supply is connected to the gas inlet.

7. The droplet generator of claim 1, wherein the nozzle has a nozzle tip made of silicon or a silicon-based compound.

8. An extreme ultraviolet lithography (EUVL) tool, comprising:
an extreme ultraviolet radiation source;
an exposure device; and
a laser source,
wherein the extreme ultraviolet radiation source comprises:
a chamber;
a droplet generator configured to generate target droplets located on a first side of the chamber;
a laser produced plasma collector located on a second side of the chamber adjacent the first side configured to collect, focus, and direct extreme ultraviolet radiation towards the exposure device; and
a droplet catcher located on a third side of the chamber opposing the droplet generator,
wherein the droplet generator comprises:
a reservoir for a molten metal;
a nozzle having a first end connected to the reservoir and a second opposing end where molten metal droplets emerge from the nozzle;
a pressure sensor configured to measure pressure in the chamber;
a gas inlet directly connected to the nozzle; and
an isolation valve at the second end of the nozzle and connected to the nozzle,
wherein the isolation valve is configured to seal the droplet generator from the chamber from an ambient atmosphere outside the chamber, and
wherein a controller operatively connected to the pressure sensor is configured to close the isolation valve, initiate an inert gas flow to the nozzle through the gas inlet, and activate an uninterruptible power supply substantially simultaneously based on the measured pressure by the pressure sensor.

9. The extreme ultraviolet lithography tool of claim 8, further comprising a piezoelectric actuator to generate droplets at the second end of the nozzle.

10. The extreme ultraviolet lithography tool of claim 8, wherein the droplet generator further comprises a heating element connected to the nozzle.

11. The extreme ultraviolet lithography tool of claim 10, wherein the heating element is connected to the uninterruptable power supply.

12. The extreme ultraviolet lithography tool of claim 8, wherein the exposure device includes a scanner and a substrate stage for supporting a photoresist coated substrate to be imaged.

13. The extreme ultraviolet lithography tool of claim 12, wherein the exposure device further comprises a reflective mask having a pattern to be formed in the photoresist coated on the substrate.

14. The extreme ultraviolet lithography tool of claim 8, wherein the laser source is a $CO_2$ laser.

15. The extreme ultraviolet lithography tool of claim 8, wherein the collector comprises a coating material including a multilayer made up of a plurality of Mo/Si film pairs.

16. An extreme ultraviolet lithography (EUVL) tool, comprising:
an extreme ultraviolet radiation source;
an exposure device; and
a laser source,
wherein the extreme ultraviolet radiation source comprises:
a chamber;
a pressure sensor configured to measure pressure in the chamber;
a droplet generator configured to generate target droplets located on a first side of the chamber; and
a collector mirror located on a second side of the chamber adjacent the first side,
wherein droplet generator comprises:
a reservoir for a molten metal;
a nozzle having a first end connected to the reservoir and a second opposing end where molten metal droplets emerge from the nozzle;
a gas inlet directly connected to the nozzle; and
an isolation valve at the second end of the nozzle configured to seal the droplet generator from the chamber, and from an ambient atmosphere outside the chamber, and
wherein a controller operatively connected to the pressure sensor is configured to close the isolation valve, initiate an inert gas flow to the nozzle through the gas inlet, and activate an uninterruptable power supply substantially simultaneously based on the measured pressure by the pressure sensor.

17. The extreme ultraviolet lithography tool of claim 16, further comprising a piezoelectric actuator to generate droplets at the second end of the nozzle.

18. The extreme ultraviolet lithography tool of claim 16, herein the droplet generator further comprises a heating element connected to the nozzle.

19. The extreme ultraviolet lithography tool of claim 18, wherein the heating element is connected to an uninterruptable power supply.

20. The extreme ultraviolet lithography tool of claim 16, further comprising an inert gas supply is connected to the droplet generator.

21. The extreme ultraviolet lithography tool of claim 16, further comprising the controller controlling the isolation valve.

* * * * *